(12) United States Patent
Tanaka et al.

(10) Patent No.: US 7,580,433 B2
(45) Date of Patent: Aug. 25, 2009

(54) LASER SYSTEM

(75) Inventors: Tomiji Tanaka, Saitama (JP); Kageyasu Sako, Tokyo (JP); Ryo Kasegawa, Tokyo (JP); Shinji Yamada, Kanagawa (JP); Katsuhiro Agatsuma, Miyagi (JP)

(73) Assignee: Sony Corporation, Tokyo (JP)

( * ) Notice: Subject to any disclaimer, the term of this patent is extended or adjusted under 35 U.S.C. 154(b) by 160 days.

(21) Appl. No.: 11/742,800

(22) Filed: May 1, 2007

(65) Prior Publication Data
US 2008/0180659 A1 Jul. 31, 2008

(30) Foreign Application Priority Data
May 10, 2006 (JP) .............................. 2006-131490

(51) Int. Cl.
*H01S 3/04* (2006.01)
(52) U.S. Cl. .......................................... 372/34; 372/33
(58) Field of Classification Search ............... 372/44.01, 372/22, 33; 356/300; 385/27
See application file for complete search history.

(56) References Cited

U.S. PATENT DOCUMENTS

| 6,661,814 | B1* | 12/2003 | Chapman et al. ................ 372/6 |
| 6,724,790 | B1* | 4/2004 | Daiber et al. .................. 372/34 |
| 6,763,047 | B2* | 7/2004 | Daiber et al. .................. 372/34 |

FOREIGN PATENT DOCUMENTS

| JP | 02-295182 | 12/1990 |
| JP | 09-260792 | 10/1997 |
| JP | 10-107377 | 4/1998 |
| JP | 2002-204023 | 7/2002 |
| JP | 2004-103868 | 4/2004 |
| JP | 2006-114183 | 4/2006 |

OTHER PUBLICATIONS

Toishi Mitsuru et al.; Temperature tolerance improvement with wavelength tuning laser source in holographic data storage; Technical Digest of Optical Data Storage/International Symposium.
Tanaka Tomiji et al.; Littrow-type blue laser for holographic data storage; Technical Digest of Optical Storage; 2004; p. 311.
Japanese Office Action dated Jul. 22, 2008 for Application No. 2006-131490.
Japanese Office Action issued on Mar. 4, 2008 in connection with Japanese Patent Application No. 2006-131490.

* cited by examiner

*Primary Examiner*—Minsun Harvey
*Assistant Examiner*—Tuan N. Nguyen
(74) *Attorney, Agent, or Firm*—Sonnenschein Nath & Rosenthal LLP

(57) ABSTRACT

A laser system includes a laser diode that oscillates in a multi-mode and has characteristics in which its oscillation wavelength varies with temperature, a grating that receives a light beam emitted from the laser diode and returns a diffracted beam to the laser diode, a mechanism that changes the wavelength of the diffracted beam returned to the laser diode, a wavelength detector that detects the wavelength of an output beam which is the same as that of the diffracted beam returned to the laser diode, a temperature regulator that maintains the laser diode at a predetermined temperature, and a control unit that controls the mechanism so that the output beam having a predetermined wavelength is output and controls the temperature regulator so that the laser diode oscillates at the predetermined wavelength.

6 Claims, 6 Drawing Sheets

LASER SYSTEM

CROSS REFERENCES TO RELATED APPLICATIONS

The present invention contains subject matter related to Japanese Patent Application JP 2006-131490 filed in the Japanese Patent Office on May 10, 2006, the entire contents of which are incorporated herein by reference.

BACKGROUND OF THE INVENTION

1. Field of the Invention

The present invention relates to laser systems.

2. Description of the Related Art

In various industrial fields, semiconductor lasers are used as light sources emitting coherent light. For example, many semiconductor lasers are used in optical data storage devices. Under these industrial circumstances, demands for a light source capable of changing the wavelength of coherent light are gradually increasing. The fields in which demands for such a light source, for example, an optical data storage field includes holographic recording and reproducing apparatuses, serving as next-generation recording and reproducing apparatuses.

In the holographic recording and reproducing apparatuses, a signal beam and a reference beam are emitted from a single laser source. The signal beam is modulated on the basis of information (recording data) to be recorded for each page. The signal and reference beams are applied to a holographic recording medium. The signal beam interferes with the reference beam in the holographic recording medium, thus producing an interference fringe pattern in the medium. The interference fringe pattern is formed as a diffraction grating (hologram) based on a change in refractive index or transmittance of the holographic recording medium, thus recording the recording data. On the other hand, in a holographic reproducing apparatus for reproducing recording data from a diffraction grating (hologram) formed as described above, a photodetector detects a diffracted beam (reconstructed beam) generated by irradiation of the diffraction grating (hologram) formed in the recording medium with the reference beam, thus reproducing the recording data.

As a laser source used in such a holographic recording and reproducing apparatus, a nearly single-mode laser source is preferably used. According to a method, when the temperature of a holographic recording and reproducing apparatus varies, the wavelength of a light beam emitted from a laser source is changed to improve the recording and reproducing characteristics. This method is proposed by Mitsuru Toishi, et al. "Temperature Tolerance Improvement with Wavelength Tuning Laser Source in Holographic Data Storage", Technical Digest of Optical Data Storage/International Symposium on Optical Memory 2005 ThE5. Light sources capable of changing the wavelength of coherent light are requested for the above-described application.

The above-described laser sources include a Littrow laser system. FIG. 10 shows an example of a Littrow laser system. In the Littrow laser system, a multi-mode laser diode (LD) 101 emits a light beam. A lens 103 collimates the light beam passing therethrough. A grating 102 is irradiated with the collimated light beam. The grating 102 is rotated about a support 105 through a screw 104 to adjust the angle of the grating 102 relative to the LD 101. A light beam having the same wavelength as that of a first-order beam, which is diffracted by the grating 102 and is returned to the LD 101, is selected and is oscillated, so that a zero-order beam is obtained. The above-described Littrow laser system is proposed by Tomiji Tanaka, et al. "Littrow-Type Blue Laser for Holographic Data Storage", Technical Digest of Optical Data Storage 2004, p. 311. A Littman laser system is also known as another type of laser system. In the Littman laser system, the positional relationship between a diffraction grating and a laser diode is fixed and a light beam diffracted by the diffraction grating is returned to the laser diode by using a mirror.

SUMMARY OF THE INVENTION

When the temperature of a holographic recording medium used for holographic recording and reproducing varies, changing the wavelength of a laser beam is effective in improving the recording and reproducing characteristics. Tunable laser systems, such as a Littrow laser system and a Littman laser system described above, have a narrow variable wavelength range and are required to increase the variable wavelength range in order to improve the recording and reproducing characteristics. Unfortunately, a laser system capable of changing the wavelength of a laser beam in a wide range is not provided.

It is desirable to provide a laser system capable of changing the wavelength of a laser beam in a wide range.

According to an embodiment of the present invention, a laser system includes the following elements: A laser diode oscillates in a multi-mode and has characteristics in which its oscillation wavelength varies with temperature. A grating receives a light beam emitted from the laser diode and returns a diffracted beam to the laser diode. A mechanism changes the wavelength of the diffracted beam returned to the laser diode. A wavelength detector detects the wavelength of an output beam which is the same as that of the diffracted beam returned to the laser diode. A temperature regulator maintains the laser diode at a predetermined temperature. A control unit controls the mechanism so that the output beam having a predetermined wavelength is output and controls the temperature regulator so that the laser diode oscillates at the predetermined wavelength.

In this laser system, the mechanism changes the wavelength of a diffracted beam returned from the grating to the laser diode, thus changing the wavelength of an output light beam. In addition, the temperature regulator maintains the laser diode at a predetermined temperature. The wavelength of the output light beam is changed in a wide range in this manner.

According to another embodiment of the present invention, there is provided a laser system for use in an electronic apparatus. The laser system includes the following elements: A laser diode oscillates in a multi-mode and has characteristics in which its oscillation wavelength varies with temperature. A grating receives a light beam emitted from the laser diode and returns a diffracted beam to the laser diode. A mechanism changes the wavelength of the diffracted beam returned to the laser diode. A wavelength detector detects the wavelength of an output beam which is the same as that of the diffracted beam returned to the laser diode. An operating-temperature detector detects the temperature of the electronic apparatus or a member used in combination with the electronic apparatus. A temperature regulator maintains the laser diode at a predetermined temperature. A control unit determines the predetermined wavelength on the basis of a temperature detected by the operating-temperature detector, controls the mechanism so that the output beam having the predetermined wavelength is output, and controls the temperature regulator so that the laser diode oscillates at the predetermined wavelength.

In this laser system, the operating-temperature detector detects the temperature of the electronic apparatus or a member used in combination with the apparatus. The mechanism changes the wavelength of a diffracted beam from the grating to the laser diode in accordance with the temperature to change the wavelength of an output light beam. The temperature regulator maintains the laser diode at a predetermined temperature. The wavelength of the output light beam is changed in a wide range and the wavelength is held at a predetermined value in this manner.

According to the embodiments of the present invention, the laser systems capable of changing the wavelength of a laser beam in a wide range can be provided.

DESCRIPTION OF THE PREFERRED EMBODIMENTS

Laser System

Figure 1:
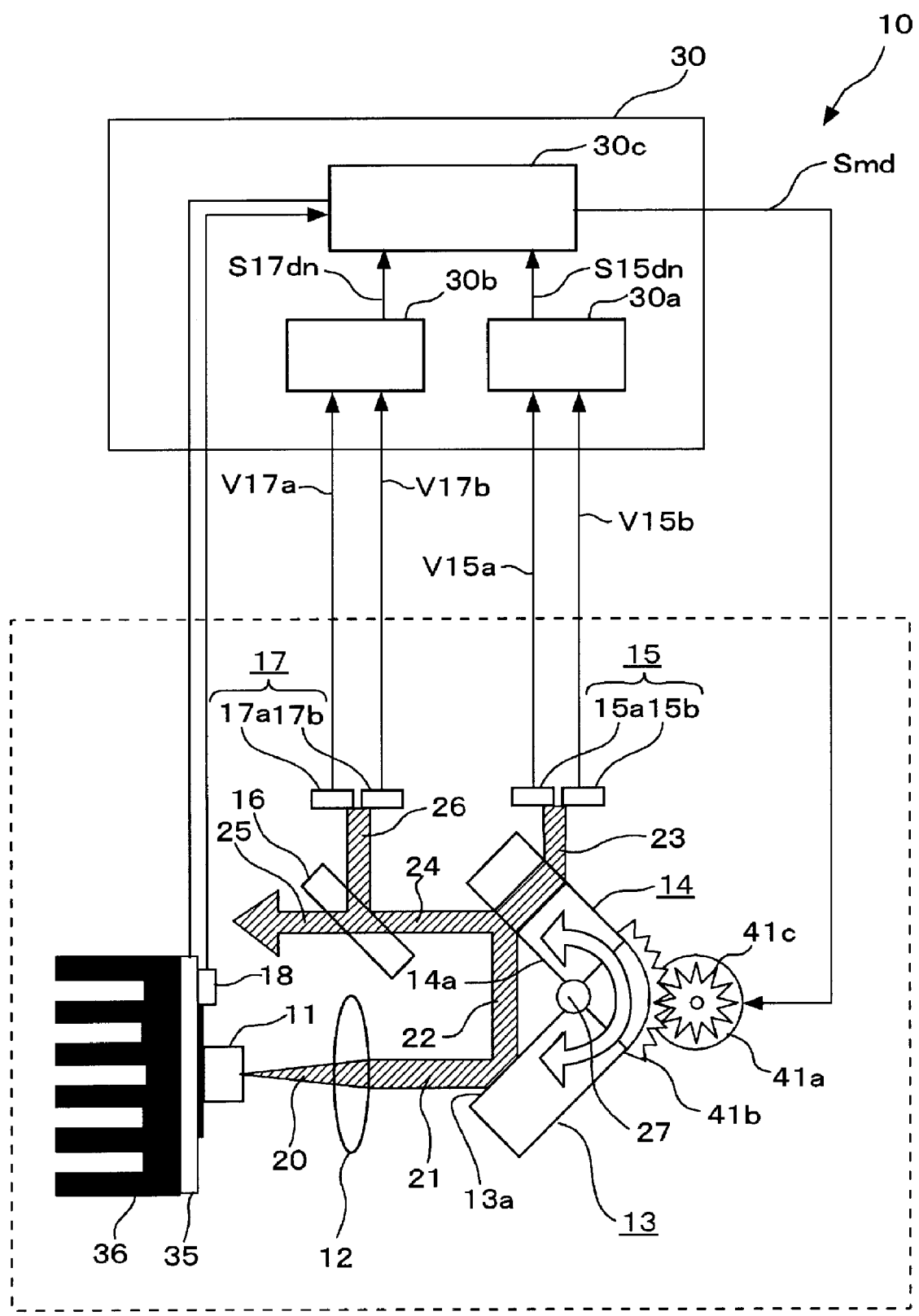
FIG. 1 is a diagram explaining the structure of a laser system according to an embodiment of the present invention.

A laser system 10 according to an embodiment of the present invention will be described with reference to FIG. 1. The laser system 10 includes a laser diode 11, a collimating lens 12, a grating 13, a mirror 14, and a wavelength detector 15 as major optical elements.

The laser diode 11 is of a multi-mode type. The laser diode 11 has characteristics in which its oscillation wavelength varies with temperature. The laser system 10 is an external cavity laser system in which the mirror 14 and the grating 13 constitute an external cavity. The laser system 10 is of a Littrow type.

The mirror 14 and the grating 13 are fixed and are rotatable about a rotating shaft 27 in both directions shown by arrows in FIG. 1. In this instance, the rotating shaft 27 corresponds to the line of intersection of an extension of a surface (hereinafter, referred to as a grating surface) 13a of the grating 13 and an extension of a surface (hereinafter, a mirror surface) 14a of the mirror 14. The laser system 10 includes a motor 41a and two gears 41b and 41c as a rotating assembly for rotating the mirror 14 and the grating 13 about the rotating shaft 27. In other words, the gear 41b is fixed to the mirror 14 and the grating 13, the gear 41c is arranged so as to engage with the gear 41b, and the gear 41c is coupled to a rotating shaft of the motor 41a. Accordingly, the mirror 14 and the grating 13 can be rotated about the rotating shaft 27 by rotation of the motor 41a while the angle which the grating surface 13a forms with the mirror surface 14a is kept at a predetermined angle, e.g., 90°. Since the laser system 10 has such a mechanism, the laser system 10 can change the wavelength of a diffracted beam returning to the laser diode as will be described later. Consequently, an output light beam obtained through the mirror 14 can be used in various electronic apparatuses.

The laser system 10 further includes a Peltier element 35, a radiator 36, and a temperature detector 18, which are used for control of the temperature of the laser diode 11. The Peltier element 35 utilizes the Peltier effect and includes materials exhibiting different thermoelectric powers to enable cooling or heating. The Peltier element 35 has a plate shape and is widely available as a thermo module. When a current is supplied to such a thermo module, one surface is cooled and the other surface is heated. Changing the direction of current flowing through the Peltier element 35 allows for switching between the heated and cooled surfaces. One surface of the Peltier element 35 is in contact with the laser diode 11 to cool or heat the laser diode 11. The radiator 36 for efficient cooling and heating is composed of a low heat resistant material. The temperature detector 18 detects the temperature of the laser diode 11. The temperature detector 18 and the Peltier element 35 are thermally coupled to the laser diode 11 and function in combination as a temperature regulator.

The laser system 10 further includes a control unit 30. The control unit 30 allows the temperature detector 18 to detect the temperature of the laser diode 11, thus controlling the temperature of the laser diode 11. In addition, the control unit 30 detects a signal from the wavelength detector 15 and controls the motor 41a in response to the signal. The control unit 30 includes a processor 30c and a wavelength detection operator 30a. The processor 30c includes hardware, such as a random access memory (RAM), a read only memory (ROM), interfaces (e.g., an A/D converter, a D/A converter, and a power amplifier) with external circuits, and a central processing unit (CPU), and software describing a procedure which is stored in the ROM and is performed by the CPU. The wavelength detection operator 30a includes an operational amplifier for performing operations, such as subtraction and addition, on electrical signals supplied from detector segments 15a and 15b and a divider for performing a division.

The control unit 30 controls the above-described mechanism to determine the wavelength of an output light beam, i.e., the resonant wavelength of the external cavity and controls the temperature regulator to control the oscillation wavelength of the laser diode 11. Control by the control unit 30 will be described later.

The above-described components are major components of the laser system 10 according to the present embodiment. The laser system 10 is provided with a mode-hop monitor as an additional component. The mode-hop monitor includes an optical wedge 16 located in the optical path, a mode-hop detector 17, a mode-hop operator 30b, and the processor 30c. The mode-hop operator 30b and the processor 30c are arranged in the control unit 30.

The operation of the laser system 10 in FIG. 1 will now be described. A light beam 20 emitted from the laser diode 11 is collimated by the collimating lens 12. A collimated light beam 21 is incident on the grating 13 and is diffracted into first-order beams traveling in different directions depending on wavelength. Although the beam is diffracted into first-order beams in different directions depending on wavelength by the grating 13, one of those first-order beams returns to the laser diode 11. The wavelength of the first-order beam returning to the laser diode 11 becomes predominant. The laser diode 11 performs single-mode oscillation with the wavelength. In this instance, which wavelength the first-order beam returning to the laser diode 11 has is uniquely determined on the basis of the angle formed by the laser diode 11 with the grating surface 13a in FIG. 1.

Most of the beam is reflected as a light beam (zero-order beam) 22 by the grating 13 as if the grating 13 is a mirror. The zero-order beam 22 is further guided as a light beam (zero-order beam) 24, therefore, a light beam (zero-order beam) 25 through the optical path. The zero-order beam 25 can be used as an output light beam in various electronic apparatuses, e.g., a holographic recording and reproducing apparatus. When the angle of the grating 13 relative to the laser diode 11 is changed, the wavelength of a laser beam can be changed. Unfortunately, the traveling direction of the zero-order beam is changed. It is difficult to utilize the zero-order beam in various apparatuses. In accordance with the present embodiment, the laser system 10 includes the mirror 14 which is operatively associated with the grating 13. The zero-order beam 22 coming from the grating 13 is reflected by the mirror 14, namely, the traveling direction of the zero-order beam 22 is changed. The resultant beam serves as the zero-order beam 24.

The zero-order beam 24 passes through the optical wedge 16, so that the zero-order beam 25 is finally obtained. In this instance, if the outgoing direction of the zero-order beam 25, serving as an output light beam, is fixed, the laser system 10 can be effectively used in various apparatuses. How to fix the outgoing direction of the zero-order beam 25 will now be described. It is assumed that the mirror 14 is a transmissive mirror that partially transmits a light beam reached the mirror surface 14a such that the light beam passes through to the rear of the mirror 14.

A condition for fixing the outgoing direction of the zero-order beam 25 is the arrangement of the rotating shaft 27 at the point of intersection of the line extending along the mirror surface 14a and that extending along the grating surface 13a. In other words, the mirror 14 and the grating 13 are rotated about the rotating shaft 27 while the relationship therebetween with respect to the rotating shaft 27 is kept, thus allowing the laser system 10 to oscillate at a desired frequency, i.e., to function as a tunable laser. Therefore, the resonant wavelength of the external cavity is uniquely determined by the angle formed by the grating surface 13a with the laser diode 11. When the laser diode 11 can emit a light beam within the range of the resonant wavelength, the light beam with this wavelength can be used as an output light beam (zero-order beam 25).

In order to achieve a purpose of allowing the laser system to oscillate at a desired frequency, the wavelength detector 15, the control unit 30, the motor 41a, the gears 41b and 41c are arranged as described above. In other words, the motor 41a and the gears 41b and 41c function as the rotating assembly for changing the wavelength of a laser beam. The wavelength detector 15 and the control unit 30 function so as to detect the wavelength of a laser beam.

How to detect the wavelength of a laser beam with the above-described arrangement will now be described. A light beam 23 that is approximately 5% of the zero-order beam 22 reflected by the grating 13 transmits through the mirror 14 and reaches the wavelength detector 15. In this instance, the position of an irradiated portion (hereinafter, referred to as an irradiation position) in the wavelength detector 15 with the light beam 23 is changed by rotation of the grating 13 and the mirror 14.

The wavelength detector 15 is composed of two detector segments arranged so as to detect a change in irradiation position. The difference between electrical signals detected by the two detector segments 15a and 15b is detected as an electrical signal and the electrical signal is normalized to obtain a normalized wavelength detection signal S15dn, which is related to the wavelength of the light beam 23, therefore, the wavelength of the zero-order beam 25.

Figure 2:
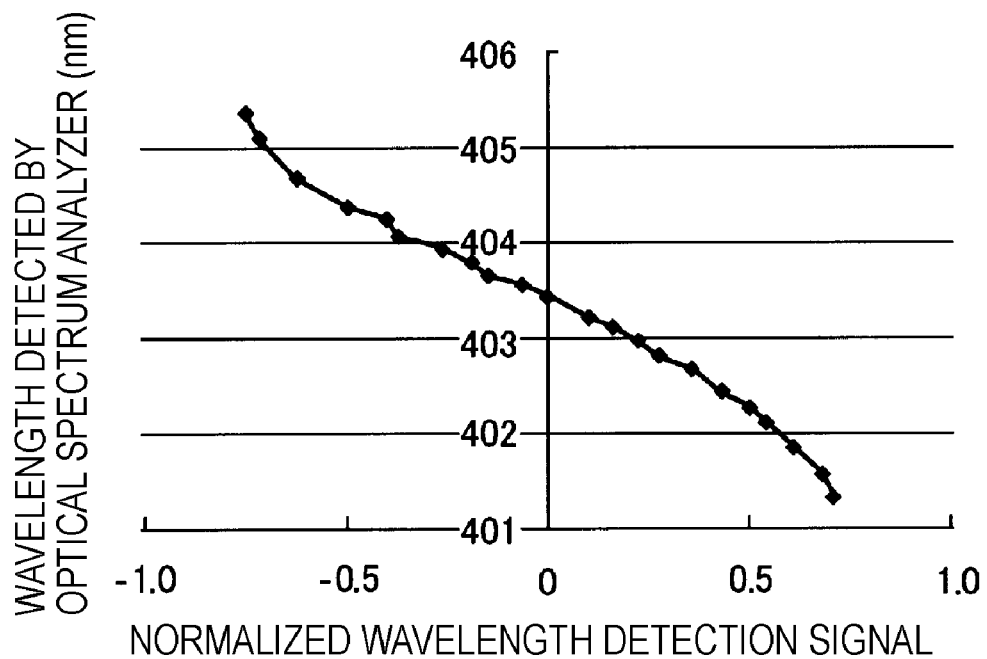
FIG. 2 is a graph showing the relationship between a normalized wavelength detection signal and the wavelength of a light beam in the laser system according to the embodiment.

FIG. 2 shows the relationship between the normalized wavelength detection signal S15dn and the wavelength of the zero-order beam 25 emitted from the laser system 10, the wavelength being detected by an optical spectrum analyzer. The abscissa represents the normalized wavelength detection signal S15dn expressed by an absolute number because the signal is normalized. The ordinate represents the wavelength, detected by the spectrum analyzer, expressed in units of nanometers (nm). Assuming that the wavelength of the zero-order beam 25 in relation to the normalized wavelength detection signal S15dn is previously known, the wavelength of the zero-order beam 25, serving as an output light beam, can be precisely known by detection of the normalized wavelength detection signal S15dn. Therefore, the wavelength of the zero-order beam 25 can be set to a desired value by the action of the mechanism.

The normalized wavelength detection signal S15dn is obtained as follows: First, the wavelength detection operator 30a obtains voltages V15a and V15b, the voltage V15a serving as an electrical signal supplied from the detector segment 15a constituting the wavelength detector 15, the voltage V15b serving as an electrical signal supplied from the other detector segment 15b. Subsequently, the wavelength detection operator 30a obtains a wavelength detection signal S15d, serving as the difference between those signals and divides the wavelength detection signal S15d by a wavelength sum signal S15s indicative of the sum of the voltages V15a and V15b. The following expression 1 represents the normalized wavelength detection signal S15dn. The use of the normalized wavelength detection signal S15dn allows for obtaining a signal that depends not on the intensity of the light beam 23, but on the wavelength thereof.

$$S15dn = S15d/S15s = (V15a - V15b)/(V15a + V15b) \quad (1)$$

A process of obtaining a desired resonant frequency performed by the laser system 10 will be described in detail below.

First, the normalized wavelength detection signal S15dn is obtained from the wavelength detection operator 30a. Subsequently, the normalized wavelength detection signal S15dn is converted into the wavelength of a laser beam with reference to a conversion table stored in a predetermined area in the RAM included in the processor 30c of the control unit 30. The conversion table is made on the basis of the graph of FIG. 2. In other words, the above-described conversion table relates the wavelength of the zero-order beam 25 measured by the optical spectrum analyzer to the normalized wavelength detection signal S15dn.

Subsequently, an error wavelength, serving as the difference between the wavelength of a desired light beam (zero-order beam 25) and that of the current light beam 23 obtained from the conversion table is calculated. The error wavelength is multiplied by a gain for frequency correction, thus optimizing a control system. Optimizing the control system is a technique generally performed. Further, a digital signal supplied from the processor 30c is converted into an analog signal through the D/A converter. After that, the signal is subjected to power amplification, thus obtaining a motor drive signal Smd. The motor drive signal Smd is output from the control unit 30 to the motor 41a.

As described above, a feedback control mechanism is constructed to control the motor 41a so that the error wavelength is equal to zero. Consequently, the positions of the grating 13 and the mirror 14 are controlled so that the zero-order beam 25 with a desired wavelength is emitted from the laser system 10. In other words, the laser system 10 includes the wavelength detector 15 composed of the two detector segments for sensing the light beam 23, which passes through the mirror 14 and comes from the rear of the mirror 14, and detecting an electrical signal corresponding to the wavelength of the light beam 23. The control unit 30 controls the mechanism so that the desired wavelength (predetermined wavelength) depending on the temperature of a holographic recording medium is equal to that of the light beam 23, passing through the mirror 14 and coming from the rear of the mirror 14, obtained from the normalized wavelength detection signal S15dn as an electrical signal, i.e., the wavelength of the current light beam 23 obtained by referring to the conversion table on the basis of the normalized wavelength detection signal S15dn.

The laser system 10 further includes the mode-hop monitor. As described above, the mode-hop monitor includes the optical wedge 16 located in the optical path, the mode-hop detector 17, the mode-hop operator 30b, and the processor 30c, the mode-hop operator 30b and the processor 30c being arranged in the control unit 30.

Light reflected by the front and rear surfaces of the optical wedge 16 forms an interference fringe pattern on the photosensitive surface of the mode-hop detector 17. When the wavelength of a light beam 26 changes, i.e., a mode hop occurs, the interference fringe pattern moves. Accordingly, the mode hope can be detected by sensing the movement. It is assumed that the intensity (quantity) of the light beam 26 is set to, for example, 10% of the intensity (quantity) of the light beam (zero-order beam) 24 or lower.

The mode-hop detector 17 is composed of two detector segments 17a and 17b arranged so as to detect a change in the above-described interference fringe pattern. The mode-hop detector 17 detects a mode hop signal S17d, serving as an electrical signal indicative of the difference between electrical signals detected by the two detector segments 17a and 17b, and normalizes the signal to obtain a normalized mode hop signal S17dn, thus detecting a so-called mode hop, serving as a jump in laser wavelength.

Specifically, the mode-hop operator 30b obtains the normalized mode hop signal S17dn by dividing a mode-hop sum signal S17s into the mode hop signal S17d as expressed in the following expression (2). The mode hop signal S17d indicates the difference between a voltage V17a, serving as an electrical signal supplied from the detector segment 17a, and a voltage V17b, serving as an electrical signal supplied from the detector segment 17b. The mode-hop sum signal S17s indicates the sum of the voltages V17a and V17b. The use of the normalized mode hop signal S17dn allows for stable detection of a mode hop without depending on the intensity of the light beam 23.

$$S17dn = S17d/S17s = (V17a - V17b)/(V17a + V17b) \quad (2)$$

Figure 3:
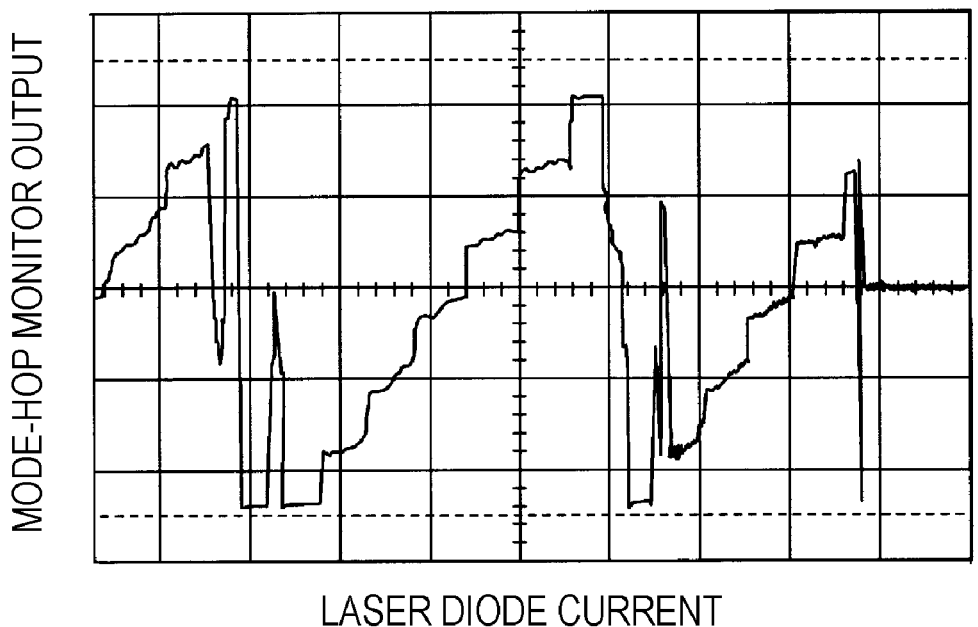
FIG. 3 is a graph showing the relationship between a signal output from a mode-hop monitor and a laser diode current in the laser system according to the embodiment.

FIG. 3 shows the relationship between a normalized mode hop signal and a diode current flowing through the laser diode 11. The graph shows the normalized mode hop signal S17dn plotted against a diode current Id flowing through the laser diode 11. Referring to FIG. 3, a rapid change in the normalized mode hop signal S17dn corresponds to a chip mode hop and a gradual stepwise change in the normalized mode hop signal S17dn corresponds to an external-cavity mode hop. Detection of a change in wavelength of the light beam 26 leads to detection of a small external-cavity mode hop and that of a large chip mode hop.

The mode-hop monitor is arranged for detection of whether a mode hop in the laser system 10 is an external-cavity mode hop or a chip mode hop. The mode-hop monitor is not necessarily provided for a tunable laser.

As described above, the wavelength of a light beam emitted from the laser system 10 is uniquely determined by the angle which the grating surface 13a forms with the laser diode 11. As a matter of course, an output light beam with a desired wavelength is not obtained unless the determined wavelength lies within the oscillation wavelength of the laser diode 11. For example, when the angle formed by the grating surface 13a with the laser diode 11 is largely changed, a light beam with a wavelength corresponding to the angle is not obtained unless the laser diode 11 oscillates within a range corresponding to the angle.

The relationship between the wavelength and temperature of the laser diode 11 will now be described. For example, the oscillation wavelength of a laser diode having a wavelength of approximately 405 nm has a temperature coefficient of 0.056 nm/° C. Therefore, the wavelength of a light beam emitted from the laser system 10 can be increased by cooling or heating the laser diode 11 through the Peltier element 35.

Figure 4:
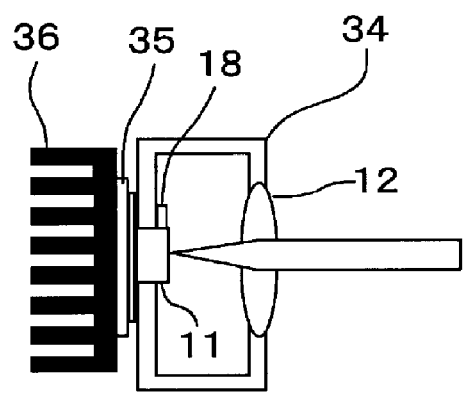
FIG. 4 is a diagram of the arrangement of a laser diode, a Peltier element, a collimating lens, and a temperature detector in the laser system according to the embodiment.

FIG. 4 shows an example of the arrangement of the laser diode 11, the Peltier element 35, the collimating lens 12, and the temperature detector 18. The laser diode 11 is arranged in a first surface of a holder 34 made of stainless used steel (SUS). The collimating lens 12 is arranged in a second surface of the holder 34, the second surface being opposed to the first surface. The temperature detector 18 thermally coupled to the laser diode 11 is disposed in the vicinity of the laser diode 11. One surface of the Peltier element 35 is thermally coupled to the laser diode 11 and the other surface thereof is thermally coupled to the radiator 36.

The reason why the holder 34 for fixing the positional relationship between the laser diode 11 and the collimating lens 12 is made of SUS that exhibits low thermal conductivity is that the laser diode 11 can be easily controlled at a constant temperature. Although the radiator 36 is attached to the other surface of the Peltier element 35, heat generated from the other surface of the Peltier element 35 may be transferred to a remote location through a heat pipe (not shown). A heater (not shown) may be used instead of the Peltier element 35. In this case, the laser diode 11 cannot be cooled but can be heated. The heater can be used within a scope of the above-described purpose. In the above example, SUS is used as a material for the holder 34. A high thermal conductivity material, such as aluminum, may be used on condition that a heat insulating material is arranged between the holder 34 and the laser diode 11.

Figure 5:
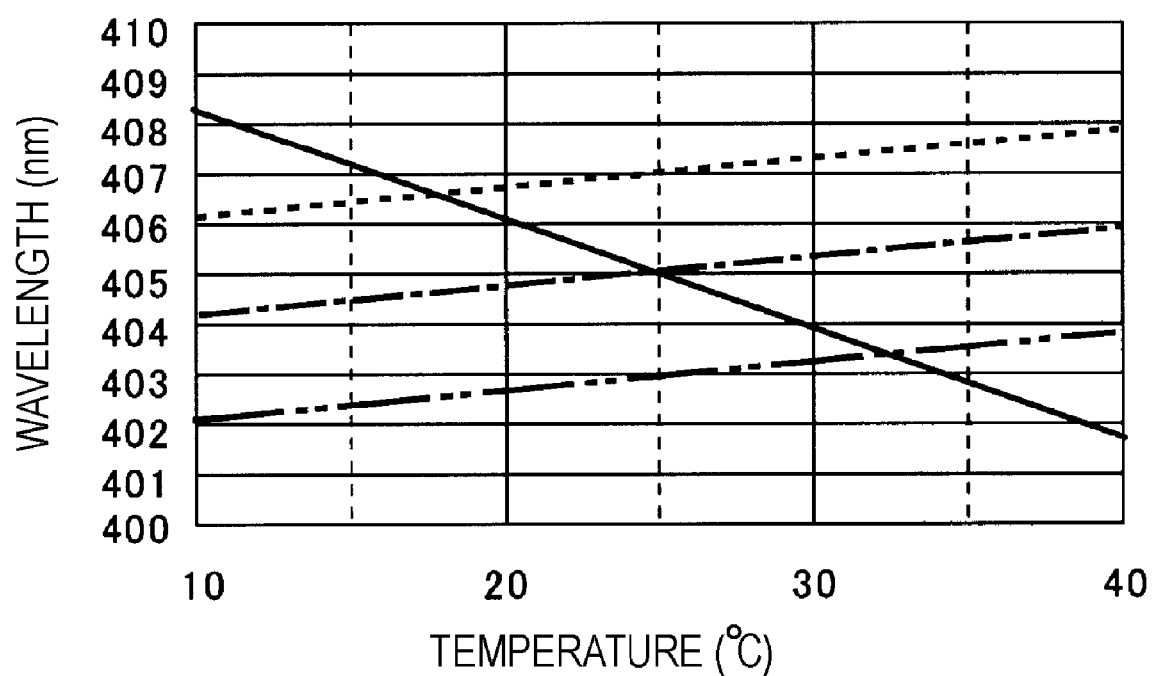
FIG. 5 is a graph showing the relationship between the oscillation wavelength of the laser system according to the embodiment and temperature.

FIG. 5 shows the relationship between the oscillation frequency of the laser diode 11 and temperature. Referring to FIG. 5, a dotted line represents the upper limit of the wavelength of the laser system 10, a dotted-chain line represents the center value thereof, and a double-dotted chain line represents the lower limit thereof. Assuming that temperature is fixed, a line is extended from a value indicating the temperature in parallel to the Y axis. The point of intersection of this extended line and the dotted line corresponds to the upper limit wavelength. The point of intersection of the extended line and the double-dotted chain line represents the lower limit wavelength.

For example, the center wavelength of the laser diode shown in this graph is 405 nm and the variable range is ±2 nm at a temperature of 25° C. Since the center wavelength of this laser diode changes at a rate of 0.056 nm/° C., the variable range depends on temperature.

In FIG. 5, a solid line represents the optimum wavelength for a holographic recording medium (see a medium 60 in FIG. 6) when the laser system 10 according to the present embodiment is applied to an electronic apparatus, e.g., a holographic recording apparatus. In this instance, the optimum wavelength of a light beam satisfies predetermined conditions of the recording/reproducing characteristics (for example, the signal-to-noise (S/N) ratio and the bit error rate (BER) are predetermined values or lower). The solid line is obtained by calculation when a substrate constituting the holographic recording medium is made of glass. When the substrate is made of plastic, such as PC, the following description is similarly valid qualitatively though the inclination of the graph is slightly changed.

The meaning of the solid line shown in FIG. 5 will be described specifically. For example, assuming that data is recorded on a holographic recording medium with a light beam having a wavelength of 405 nm at a temperature of 25° C., the graph shows that the recorded data can be reproduced using a light beam with a wavelength of 403.9 nm at 30° C. and the data can be reproduced using a laser beam with a wavelength of 407.2 nm at 15° C. Actually, even if the wavelength is slightly deviated from the above-described value, the reading (reproducing) operation can be sufficiently performed. Further, the graph shows that when data is recorded with a light beam having a wavelength of 403.9 nm at 30° C., the data can be reproduced with a laser beam having a wavelength of 407.2 nm at 15° C. In other words, when the wavelength of a laser beam emitted from the laser diode 11 is controlled at a value representing the Y coordinate of the point of intersection of the solid line and the line which extends from the X axis and represents an estimated temperature, a holographic recording medium has the good recording/reproducing characteristics. In another respect, controlling the temperature of the laser diode allows for recording and reproducing of data within a wider temperature range.

Figure 10:
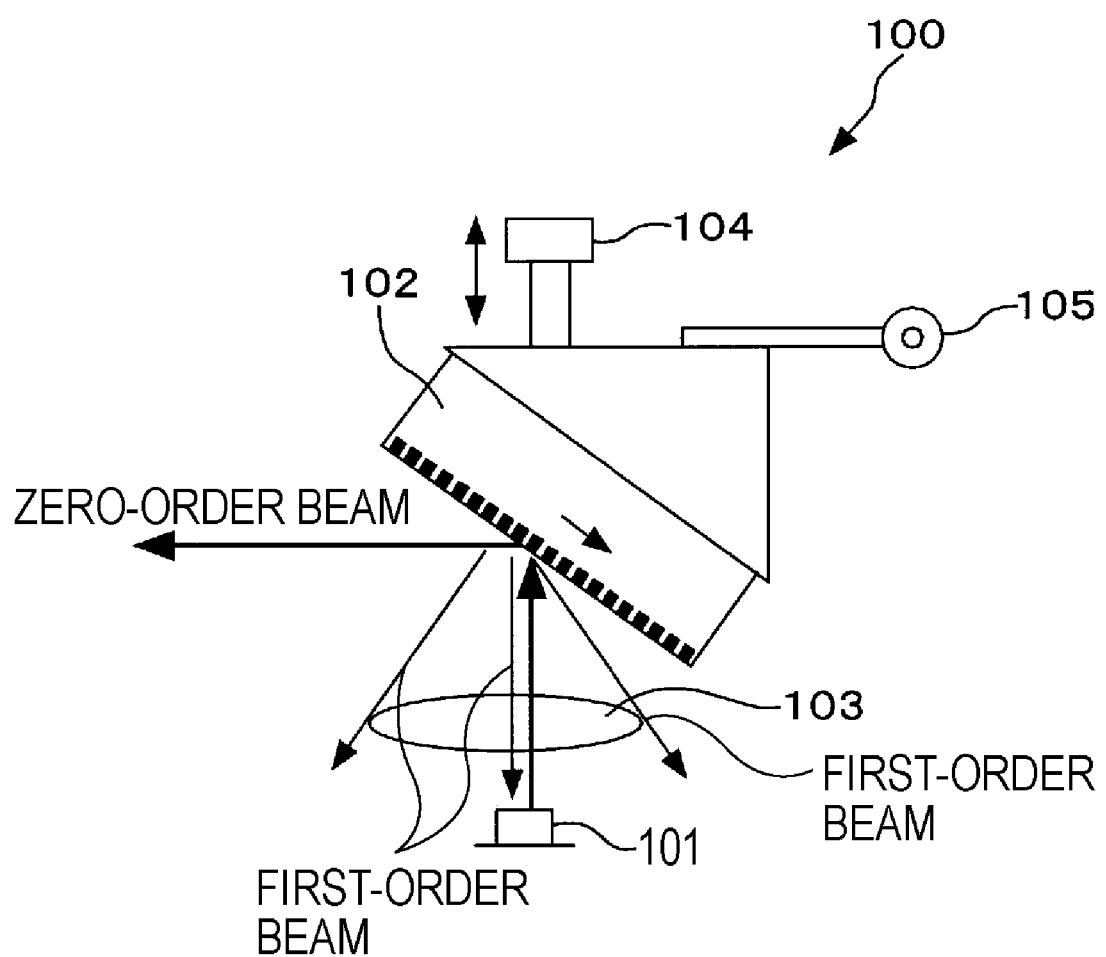
FIG. 10 is a diagram of the structure of a conventional laser system.

On the other hand, in a case where a laser system 100 in FIG. 10, which has been described in the related art, is used in the holographic recording and reproducing apparatus (see FIG. 6) instead of the laser system 10, even if a zero-order beam can be directed into the correct direction in the holographic recording and reproducing apparatus, it is difficult to record data and reproduce the recorded data over a wide temperature range because the system has no mechanism for controlling the temperature of the laser diode. For example, according to the graph showing the optimum wavelength by the solid line, the wavelength of a laser beam should be set to 402.8 nm at 35° C. The variable range of the wavelength of the laser system 100 is limited to that at 35° C., namely, lies from 403.6 nm to 407.6 nm. It is known that the wavelength cannot be set to 402.8 nm. In the use of the laser system 10 according to the present embodiment, even when the temperature of a recording medium is at 35° C., the temperature of the laser diode 11 in the laser system 10 can be controlled at, for example, 20° C. In this case, the variable range of the wavelength of a laser beam emitted from the laser diode 11 lies in the range of 402.6 nm to 406.7 nm. Accordingly, the wavelength can be set to 402.8 nm, the optimum value. In this case, the temperature of part other than the laser diode 11 of the laser system 10, for example, the external cavity including the grating 13 and the mirror 14 as major components may be controlled at 20° C. Alternatively, the temperature of part other than the laser diode 11 may be held at 35° C.

Holographic Recording and Reproducing Apparatus

Figure 6:
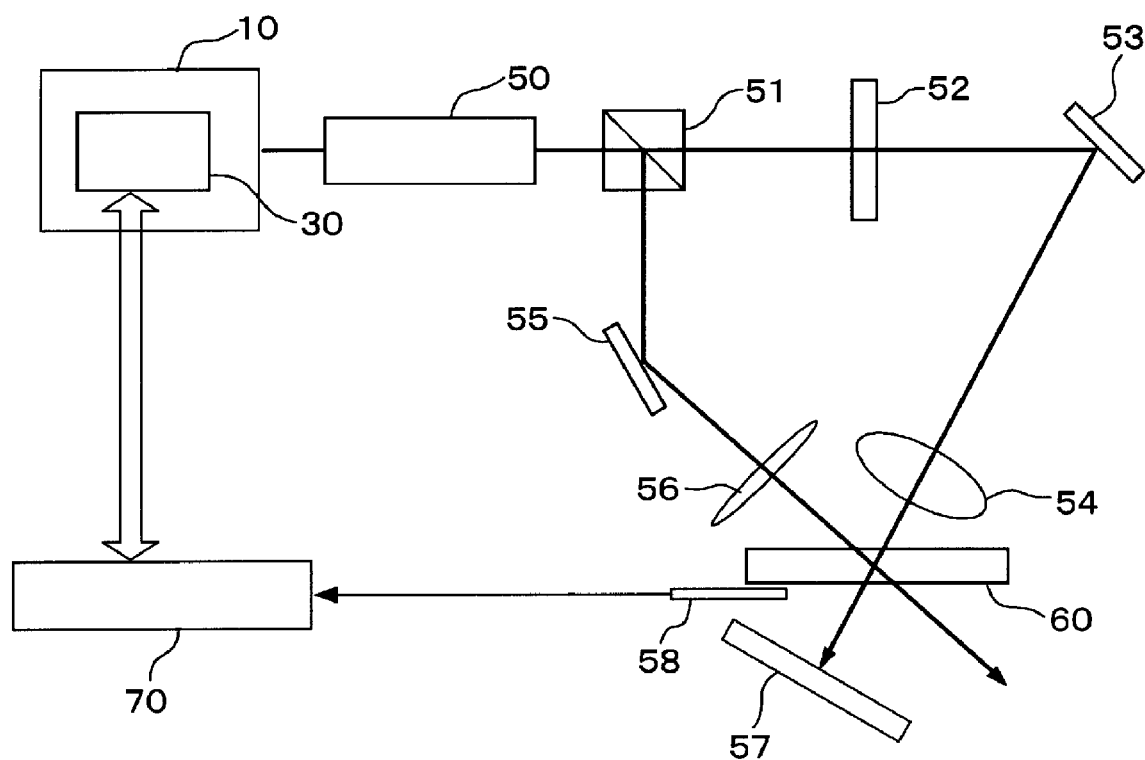
FIG. 6 is a conceptual diagram of a holographic recording and reproducing apparatus in accordance with the embodiment, FIG. 6 focusing on an optical system of the apparatus.

As described above, the laser system 10 according to the present embodiment can be used in a holographic recording and reproducing apparatus. The use of the laser system 10 in the holographic recording and reproducing apparatus will be described in more detail with reference to FIG. 6. FIG. 6 is a conceptual diagram of the holographic recording and reproducing apparatus including the above-described laser system 10 in accordance with the present embodiment, FIG. 6 focusing on an optical system of the apparatus.

The holographic recording and reproducing apparatus of FIG. 6 is of a two-beam type. The optical system of the apparatus includes the laser system 10, a spatial filter 50, a beam splitter 51, a spatial light modulator 52, a stationary mirror 53, an objective lens 54 having a relatively high NA (of about 0.6), a variable angle mirror 55, an objective lens 56 having relatively low NA, and a photodetector array 57. The spatial light modulator 52 includes liquid crystal for displaying digital information to be recorded and spatially modulates a light beam. Further, the apparatus includes an operating-temperature detector 58 for detecting the temperature of a holographic recording medium 60 and a controller 70 for controlling the whole of the apparatus. The operating-temperature detector 58 includes, for example, a thermistor and thermal holography and is arranged in the vicinity of a holographic recording medium. The operating-temperature detector 58 directly or indirectly detects the temperature of the holographic recording and reproducing apparatus, one of electronic apparatuses, or the temperature of a holographic recording medium, serving as a member used in the holographic recording and reproducing apparatus.

The holographic recording and reproducing apparatus is connected to an external apparatus, serving as another apparatus, through the controller 70. The controller 70 includes a CPU and a microcomputer, which is connected to the CPU and other components of the controller through a bus line and includes a RAM, a ROM, and an interface circuit. The controller 70 manages and controls the whole of the recording and reproducing operations of the holographic recording and reproducing apparatus. Management criteria and a control procedure (software) are stored in the ROM arranged in the controller 70.

The recording operation of the holographic recording and reproducing apparatus in FIG. 6 will now be described. As described above, the laser system 10 emits a laser beam (a light beam) having a predetermined wavelength specified among light beams. The spatial filter 50 allows the light beam to pass through, thus making the wavefront of the light beam uniform. The beam splitter 51 splits the light beam into two beams traveling in different directions. The spatial light modulator 52 performs spatial modulation on one light beam, thus obtaining a signal beam. The stationary mirror 53 reflects the signal beam and the objective lens 54 converges the signal beam onto a predetermined area in the holographic recording medium 60.

The variable angle mirror 55 reflects the other light beam, serving as a reference beam, so that the reference beam is incident on the objective lens 56 at a predetermined angle in accordance with the angle of the light beam incident on the reflecting surface of the variable angle mirror 55. The objective lens 56 converges the reference beam onto the predetermined area in the holographic recording medium 60. In this instance, changing the angle of the variable angle mirror 55 enables adjustment of the incident angle of the reference beam on the holographic recording medium.

The controller 70 controls the angle of the variable angle mirror 55. The variable angle mirror 55 is provided with an angle control mechanism (not shown) including, for example, a motor, a rack-and-pinion, and an angle sensor so that the angle of a light beam, reflected by the variable angle mirror 55, incident on the holographic recording medium 60 can be set in response to a control signal from the controller 70.

The reference beam and the signal beam produce an interference fringe pattern in a recording layer, made of photopolymer, of the holographic recording medium 60. Consequently, in the medium, monomers in a portion irradiated with a high-intensity light beam are polymerized, so that fringes (a hologram) corresponding to the refractive index are formed. In this manner, recording data, displayed in the spatial light modulator 52, is recorded in the form of a hologram for each page. When multiplexing based on angular multiplexing is performed, the angle of the variable angle mirror 55 is changed for each page and the incident angle of the reference beam on the holographic recording medium 60 is changed for each page.

The reproducing operation of the holographic recording and reproducing apparatus in FIG. 6 will now be described. During reproducing, when the holographic recording and reproducing apparatus is irradiated with a reference beam coming from the same direction as that of the reference beam during recording, the formed hologram diffracts the beam, so that a reconstructed beam is generated. The photodetector array 57, such as a CCD, is arranged in the diffracting direction of the reconstructed beam. The controller 70 processes an electrical signal supplied from the photodetector array 57, thus reproducing the recording data.

A procedure of changing the temperature of the laser diode 11 will be described. The procedure of changing the temperature of the laser diode 11 is the same in both of the recording and reproducing operations. Therefore, this procedure will be described with no distinction between the recording and reproducing operations.

First, the CPU in the controller 70 allows the operating-temperature detector 58 to detect the temperature of the holographic recording medium 60, serving as a member used in the holographic recording and reproducing apparatus.

Subsequently, the CPU in the controller 70 obtains a predetermined wavelength, serving as the optimum wavelength of an output light beam for the temperature detected by the operating-temperature detector 58, from the graph showing the optimum wavelength (refer to FIG. 5) stored in the RAM in the controller 70. In the following description, it is assumed that the temperature detected by the operating-temperature detector 58 is 35° C.

The CPU in the controller 70 confirms that the wavelength of an output light beam should be set to 402.8 nm (predetermined wavelength) at a temperature of 35° C.

Subsequently, the CPU in the controller 70 instructs the control unit 30 to set the wavelength of the zero-order beam 25 to 402.8 nm (predetermined wavelength).

In response to this instruction, the control unit 30 drives the motor 41a using a motor drive signal Smd to change the angle formed by the grating 13 with the mirror 14, thus providing the predetermined wavelength (402.8 nm) of the zero-order beam 25, serving as an output light beam.

After that, the CPU in the controller 70 reads the upper and lower limits on the wavelength of the laser system 10 at 35° C. from the RAM, obtains an oscillation wavelength range, and determines whether the wavelength of 402.8 nm (predetermined wavelength) lies within the range.

When the predetermined wavelength of 402.8 nm lies within this oscillation wavelength range, the temperature of the laser diode 11 is held at 35° C. The reason is that the zero-order beam 25 with the wavelength of 402.8 nm (predetermined wavelength) can be emitted on this condition. In this instance, this condition is similar to that the laser diode 11 is held at a predetermined temperature because a current flowing through the Peltier element 35 is set to zero in order to hold the temperature of the laser diode 11 at 35° C. However, this case does not apply to the specific example. In the specific example, if the laser diode 11 is held at 35° C., the wavelength of an output light beam is not set to 402.8 nm (predetermined wavelength).

On the other hand, if the wavelength of 402.8 nm (predetermined wavelength) does not lie within the oscillation wavelength range, the temperature of the laser diode 11 is changed. This case applies to the specific example. In other words, when determining that the predetermined wavelength does not lie within this range, the CPU in the controller 70 refers to the table, stored in the RAM, showing the relationship between a laser wavelength and temperature and instructs the control unit 30 to change the temperature of the laser diode 11 so that a laser beam having a wavelength of 402.8 nm (predetermined wavelength) can be emitted. The control unit 30 controls a current flowing through the Peltier element 35 to change the temperature of the laser diode 11 to 20° C.

In the above-described case, the temperature of the laser diode 11 is changed to 20° C. As will be obviously understood from FIG. 5, the temperature of the laser diode 11 may be changed to 10° C. As for how to set the temperature of the laser diode 11, for example, when a wavelength of 402.8 nm (predetermined wavelength) lies within the range between the upper limit (shown by the dotted line in FIG. 5) and the lower limit (shown by the double-dotted chain line in FIG. 5), the laser diode 11 may be set at any temperature. Alternatively, the laser diode 11 may be set at a temperature at which a wavelength of 402.8 nm (predetermined wavelength) corresponds to the center value (shown by the dotted-chain line in FIG. 5). Further, the temperature of the laser diode 11 may be set so that a wavelength of 402.8 nm (predetermined wavelength) lies within the range between the upper limit and the lower limit and the range is narrowed to any percent (e.g., 80 percent).

In the above description, the control on the laser system 10 in the two-beam type holographic recording and reproducing apparatus in accordance with the temperature of a holographic recording medium has been explained. The holographic recording and reproducing apparatus is not limited to the two-beam type. The laser system 10 in a coaxial holographic recording and reproducing apparatus using a signal beam and a reference beam, which have a common optical path, can be controlled in accordance with the temperature of a holographic recording medium.

Modifications of Laser System

In the above-described laser system 10, an error wavelength, serving as the difference between the wavelength of a desired zero-order beam 25 and that of the current light beam 23 obtained from the conversion table, is calculated. The feedback control mechanism is arranged for control of the motor 41a so that the error wavelength is equal to zero. The laser system 10 is controlled so as to emit the zero-order beam 25 having a desired wavelength depending on the rotated positions of the grating 13 and the mirror 14. To provide a desired wavelength, another type feedback mechanism may be arranged. Alternatively, a feedforward mechanism may be arranged.

As for another type feedback mechanism, a rotational angle detector (not shown, e.g., a rotary encoder) capable of detecting the angle of rotation of the rotating shaft 27 in the laser system 10 is newly arranged. The relationship between an angle signal corresponding to the angle of the rotating shaft detected through the rotational angle detector and the wavelength of the zero-order beam 25 is previously obtained. The wavelength of the zero-order beam 25 for each value of an angle signal is stored in the RAM included in the processor 30c of the control unit 30. After the predetermined wavelength of the zero-order beam 25 is determined, the value of an angle signal corresponding to the predetermined wavelength is read from the RAM and the motor 41a is rotated so that the value of a current angle signal agrees with that of the angle signal corresponding to the predetermined wavelength.

In the use of the above-described rotational angle detector, the wavelength of a light beam (i.e., the zero-order beam 25) can be set to a predetermined value without using the wavelength detector 15. In addition, the mirror 14 may be of a total reflection type instead of the transmissive type. Thus, a loss in the amount of light can be prevented.

Further, a simpler laser system can be constructed with a feedforward mechanism including a stepping motor as the motor 41a. In the use of the stepping motor, serving as the motor 41a, the angle of rotation of the motor 41a is determined in accordance with the number of steps accurately applied to the motor 41a. Therefore, the angle of rotation of the grating 13 and the mirror 14 which rotate about the rotating shaft 27 can be accurately determined in accordance with the number of steps. In this manner, the wavelength of a light beam can be set to a predetermined value without using the wavelength detector 15 and the rotational angular detector.

The laser system in the above-described embodiment is not limited to the above-described Littrow laser system. A Littman laser system may be used. In other words, the laser system may have any structure so long as the laser system includes a laser diode that oscillates in a multi-mode and has the temperature characteristics, a grating that receives a laser beam emitted from the laser diode and returns a diffracted beam to the laser diode, a mechanism that changes the wavelength of the diffracted beam returned to the laser, a wavelength detector that detects the wavelength of an output light beam which is the same as the wavelength of the diffracted beam returned to the laser diode, a temperature regulator that maintains the laser diode at a predetermined temperature, and a control unit that controls the mechanism so that the output light beam having a predetermined wavelength can be emitted and controls the temperature regulator so that the laser diode oscillates at the predetermined wavelength.

Figure 7:
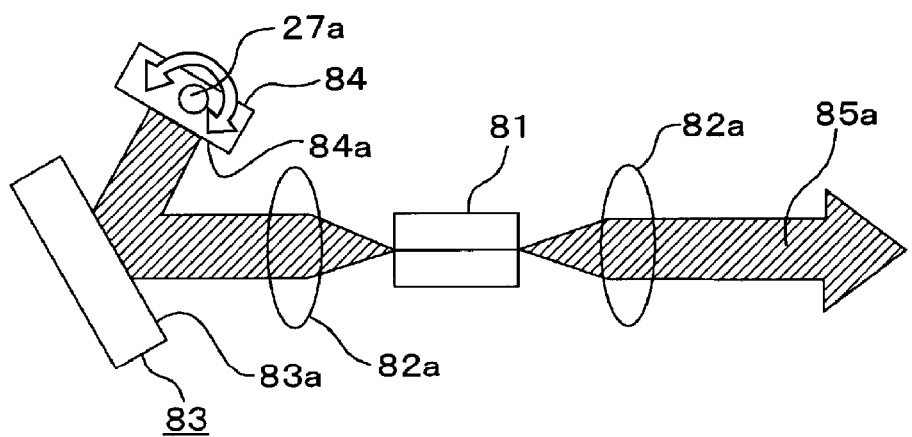
FIG. 7 is a diagram of the structure of a laser system according to another embodiment.
Figure 8:
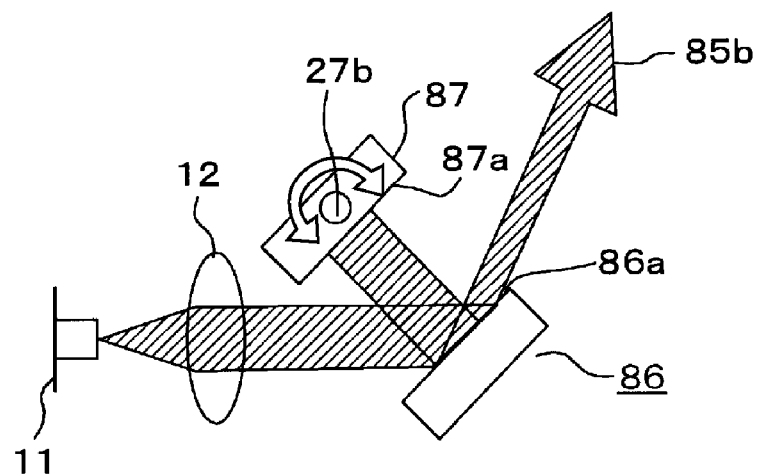
FIG. 8 is a diagram of the structure of a laser system according to another embodiment.
Figure 9:
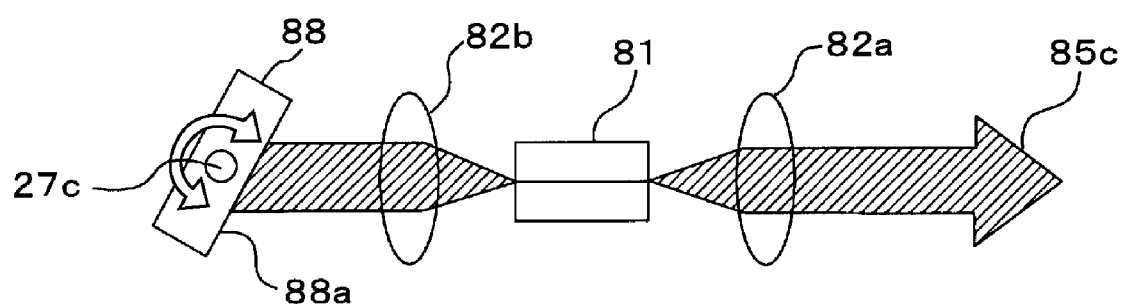
FIG. 9 is a diagram of the structure of a laser system according to another embodiment.

FIGS. 7 to 9 show laser systems of other types. A mechanism, a wavelength detector, a temperature regulator, and a control unit are not shown in each of the laser systems. In each of the laser systems shown in FIGS. 7 to 9, similar to that shown in FIG. 1, a laser diode is cooled or heated by a Peltier element, the wavelength of a light beam is detected by the wavelength detector, the wavelength is changed through a motor, and the control unit can control those components.

FIGS. 7 and 8 show Littman laser systems. FIG. 9 shows a Littrow laser system of another type. Referring to FIG. 7, the Littman laser system includes a laser diode 81, collimating lenses 82a and 82b, a grating 83 of which position relative to the laser diode 81 is fixed and which has a surface 83a, and a mirror 84 which rotates around a rotating shaft 27a and has a surface 84a. This system can provide a light beam 85a for use in recording and reproducing, the wavelength of the beam 85a depending on the angle of rotation of the mirror 84.

Referring to FIG. 8, the Littman laser system includes a laser diode 11, a collimating lens 12, a grating 86 having a surface 86a, and a mirror 87, which rotates about a rotating shaft 27b and has a surface 87a. The system can provide a light beam 85b for use in recording and reproducing, the wavelength of the beam 85b depending on the angle of rotation of the mirror 87.

Referring to FIG. 9, the Littrow laser system includes a laser diode 81, collimating lenses 82a and 82b, and a grating 88 which rotates about a rotating shaft 27c and has a surface 88a. The system can provide a light beam 85c for use in recording and reproducing, the wavelength of the beam 85c depending on the angle of rotation of the grating 88.

It should be understood that the present invention is not limited to the above-described embodiments and various modifications, combinations, sub-combinations and alterations may occur depending on design requirements and other factors insofar as they are within the scope of the appended claims or the equivalents thereof. For example, the laser systems according to the embodiments may be used in not only holographic recording and reproducing apparatuses included in electronic apparatuses but also various industrial apparatuses.

What is claimed is:

1. A laser system comprising:
a laser diode that oscillates in a multi-mode and has characteristics in which its oscillation wavelength varies with temperature;
a grating that receives a light beam emitted from the laser diode and returns a diffracted beam to the laser diode;
a mechanism that changes the wavelength of the diffracted beam returned to the laser diode;
a wavelength detector that detects the wavelength of an output beam which is the same as that of the diffracted beam returned to the laser diode;
a temperature regulator that maintains the laser diode at a predetermined temperature; and
a control unit that controls the mechanism so that the output beam having a predetermined wavelength is output and controls the temperature regulator so that the laser diode oscillates at the predetermined wavelength; and
a mirror that reflects the light beam, reflected by the grating, in a predetermined direction, and partially transmits the light beam applied to a first surface of the mirror such that the light beam passes through the mirror to the rear thereof,
wherein,
the mechanism includes a rotating assembly for rotating the grating and the mirror, and
the control unit includes a two-segment detector that receives the light beam outgoing from the rear of the mirror and detects an electrical signal corresponding to the wavelength of the light beam, and controls the rotating assembly so that the wavelength of the light beam outgoing from the rear of the mirror coincides with the predetermined wavelength.

2. The system according to claim 1,
the mechanism rotates the mirror about a rotating shaft corresponding to the line of intersection of an extension of a first surface of the grating and an extension of a first surface of the mirror while the angle formed by the first surface of the grating with that of the mirror is being held constant, each first surface being irradiated with a light beam.

3. The system according to claim 1, wherein the temperature regulator includes:
  a cooler or heater thermally coupled to the laser diode; and
  a temperature detector thermally coupled to the laser diode, and the temperature regulator controls the cooler or heater so that a temperature detected by the temperature detector is the predetermined temperature.

4. The system according to claim 1, wherein
  the control unit has a table showing the relationship between temperature and an oscillation wavelength range between the upper limit and the lower limit of the oscillation wavelength of the laser diode and controls the temperature regulator so that the predetermined oscillation wavelength lies within the oscillation wavelength range.

5. A laser system for use in an electronic apparatus, the system comprising:
  a laser diode that oscillates in a multi-mode and has characteristics in which its oscillation wavelength varies with temperature;
  a grating that receives a light beam emitted from the laser diode and returns a diffracted beam to the laser diode;
  a mechanism that changes the wavelength of the diffracted beam returned to the laser diode;
  a wavelength detector that detects the wavelength of an output beam which is the same as that of the diffracted beam returned to the laser diode;
  an operating-temperature detector that detects the temperature of the electronic apparatus or a member used in combination with the electronic apparatus;
  a temperature regulator that maintains the laser diode at a predetermined temperature; and
  a control unit that determines the predetermined wavelength on the basis of a temperature detected by the operating-temperature detector, controls the mechanism so that the output beam having the predetermined wavelength is output, and controls the temperature regulator so that the laser diode oscillates at the predetermined wavelength; and
  a mirror that reflects the light beam, reflected by the grating, in a predetermined direction, and partially transmits the light beam applied to a first surface of the mirror such that the light beam passes through the mirror to the rear thereof,
  wherein,
  the mechanism includes a rotating assembly for rotating the grating and the mirror, and
  the control unit includes a two-segment detector that receives the light beam outgoing from the rear of the mirror and detects an electrical signal corresponding to the wavelength of the light beam, and controls the rotating assembly so that the wavelength of the light beam outgoing from the rear of the mirror coincides with the predetermined wavelength.

6. The system according to claim 5, wherein
  the electronic apparatus is a holographic recording and reproducing apparatus, and
  the operating-temperature detector detects the temperature of a holographic recording medium.

\* \* \* \* \*